(12) United States Patent
Riemann et al.

(10) Patent No.: US 8,197,595 B2
(45) Date of Patent: Jun. 12, 2012

(54) METHOD AND DEVICE FOR PRODUCING THIN SILICON RODS

(75) Inventors: Helge Riemann, Schulzendorf (DE); Friedrich-Wilhelm Schulze, Kranichfeld (DE); Joerg Fischer, Berlin (DE); Matthias Renner, Wernsdorf (DE)

(73) Assignee: PV Silicon Forschungs und Produktions GmbH, Erfurt (DE)

( * ) Notice: Subject to any disclaimer, the term of this patent is extended or adjusted under 35 U.S.C. 154(b) by 0 days.

(21) Appl. No.: 13/143,738

(22) PCT Filed: Jan. 19, 2010

(86) PCT No.: PCT/DE2010/000070
§ 371 (c)(1),
(2), (4) Date: Sep. 9, 2011

(87) PCT Pub. No.: WO2010/083818
PCT Pub. Date: Jul. 29, 2010

(65) Prior Publication Data
US 2011/0314869 A1    Dec. 29, 2011

(30) Foreign Application Priority Data
Jan. 21, 2009  (DE) .......................... 10 2009 005 837

(51) Int. Cl.
*C30B 13/20* (2006.01)

(52) U.S. Cl. ................. 117/51; 117/11; 117/13; 117/14; 117/15; 117/19; 117/21; 117/30; 117/37; 117/38; 117/39; 117/49; 117/50; 117/53; 117/73; 117/76; 117/200; 117/201; 117/202; 117/206; 117/208; 117/217; 117/219; 117/222

(58) Field of Classification Search ..................... 117/11, 117/13–15, 19, 21, 30, 37–39, 49–51, 53, 117/73, 76, 200–202, 206, 208, 217, 219, 117/222, 931–932
See application file for complete search history.

(56) References Cited

U.S. PATENT DOCUMENTS

| 3,539,305 A * | 11/1970 | Keller ............................. 117/28 |
| 4,220,839 A * | 9/1980 | De Leon ....................... 219/638 |
| 2009/0068407 A1 | 3/2009 | Abrosimov et al. |
| 2011/0204044 A1 * | 8/2011 | Liu ............................... 219/672 |

FOREIGN PATENT DOCUMENTS

| DE | 2458490 A1 | 6/1976 |
| DE | 141536 A1 | 5/1980 |
| DE | 2952602 A1 | 7/1981 |
| DE | 226599 A1 | 8/1985 |
| DE | 102005016776 A1 | 10/2006 |
| WO | WO 2010060349 A1 | 6/2010 |

* cited by examiner

*Primary Examiner* — Michael Kornakov
*Assistant Examiner* — Kenneth A Bratland, Jr.
(74) *Attorney, Agent, or Firm* — Leydig, Voit & Mayer, Ltd.

(57) ABSTRACT

A method for producing thin silicon rods using a floating zone crystallization process includes supplying high frequency (HF) current to a flat induction coil having a central opening, a plurality of draw openings and a plate with a slot as a current supply of the HF current so as to provide a circumfluent current to the central opening. An upper end of a raw silicon rod is heated by induction using the flat induction coil so as to form a melt pool. A thin silicon rod is drawn upwards through each of the plurality of draw openings in the flat induction coil from the melt pool without drawing a thin silicon rod through the central opening having the circumfluent current.

21 Claims, 3 Drawing Sheets

METHOD AND DEVICE FOR PRODUCING THIN SILICON RODS

CROSS REFERENCE TO PRIOR APPLICATIONS

This application is a U.S. National Phase Application under 35 U.S.C. §371 of International Application No. PCT/DE2010/000070, filed Jan. 19, 2010, which claims benefit to German Application No. DE 10 2009 005 837.0, filed Jan. 21, 2009. The International Application was published in German on Jul. 29, 2010 as WO 2010/083818 under PCT Article 21 (2).

FIELD

The invention relates to a method and to a device for producing thin silicon rods such as those used for precipitating silicon.

BACKGROUND

Due to the sharp and continuing increase in demand for polycrystalline silicon as source material for silicon for semiconductors and as source material for solar cells, demand for thin silicon rods with a diameter of approx. 4-10 mm is also rising accordingly. Production of thin silicon rods is an essential and sometimes restrictive part of the production of silicon rods by pyrolytic deposition of silicon from trichlorosilane (a so-called Siemens process) or also from monosilane. As the total length of the thin silicon rods corresponds to the length of the Si rods produced, correspondingly large quantities of these thin rods are used with the sharp rise in the production of silicon for solar uses and for semiconductors.

Thin silicon rods are produced using the conventional pedestal method, for example, in which the rod is drawn out of the inner hole in a single-coil induction coil which melts the upper end of a raw rod with a diameter of 30-50 mm at the same time. Various methods have been described to produce silicon rods.

An example is described in DE 10 2005 016 776 A1 in which, in an initial phase, a thin throat is drawn vertically downwards through the central opening in a single-coil induction coil from a suspended melt drop by known means. When the diameter of the crystal to be drawn is suitable for the surface dimensions, rotation of the growing crystal is reduced to a speed of less than 1 rpm. A single Si crystal with an approximately round cross-section is then drawn vertically downwards in a growth phase during which the inductor used has means of producing an almost rotationally-symmetrical temperature profile at the growth phase boundary.

DE 29 52 602 A1 describes a method and a device for producing thin silicon rods. In this method, a thin silicon rod, secured at its upper end, is drawn upwards from a vertical stock rod, which is melted at its upper end by means of an induction coil. In order to stabilise the thin silicon rod as it grows, corresponding stabilisation measures are provided consisting of spring rods between which the thin silicon rod is guided.

DE 24 58 490 A1 describes another method for producing thin rods. In this method, circular bent thin rods for the support matrix are drawn during material deposition by drawing off from the melted point of a thick rod by means of an annular induction coil along a circular path using a motor with a very low gear and a purely rotational movement.

In each case, only one thin rod can be drawn from the melted part of a raw rod in the above-mentioned method.

Square cores can also be used to precipitate polycrystalline Si rods, these being sawn from large Si rods such as strips. Sawn square cores have an uneven, contaminated surface. As a result they are very sensitive to breakage and must be etched and cleaned by wet chemical processes. If they have been sawn from original, precipitated, very pure polysilicon rods they also have an unfavourably high electrical resistance which complicates the start of the deposition process. They are also always somewhat shorter than the rod used, from which they were sawn.

SUMMARY

In an embodiment, the present invention provides a method for producing thin silicon rods using a floating zone crystallization process includes supplying high frequency (HF) current to a flat induction coil having a central opening, a plurality of draw openings and a plate with a slot as a current supply of the HF current so as to provide a circumfluent current to the central opening. An upper end of a raw silicon rod is heated by induction using the flat induction coil so as to form a melt pool. A respective thin silicon rod is drawn upwards through each of the plurality of draw openings in the flat induction coil from the melt pool without drawing a thin silicon rod through the central opening having the circumfluent current.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

Figure 1:
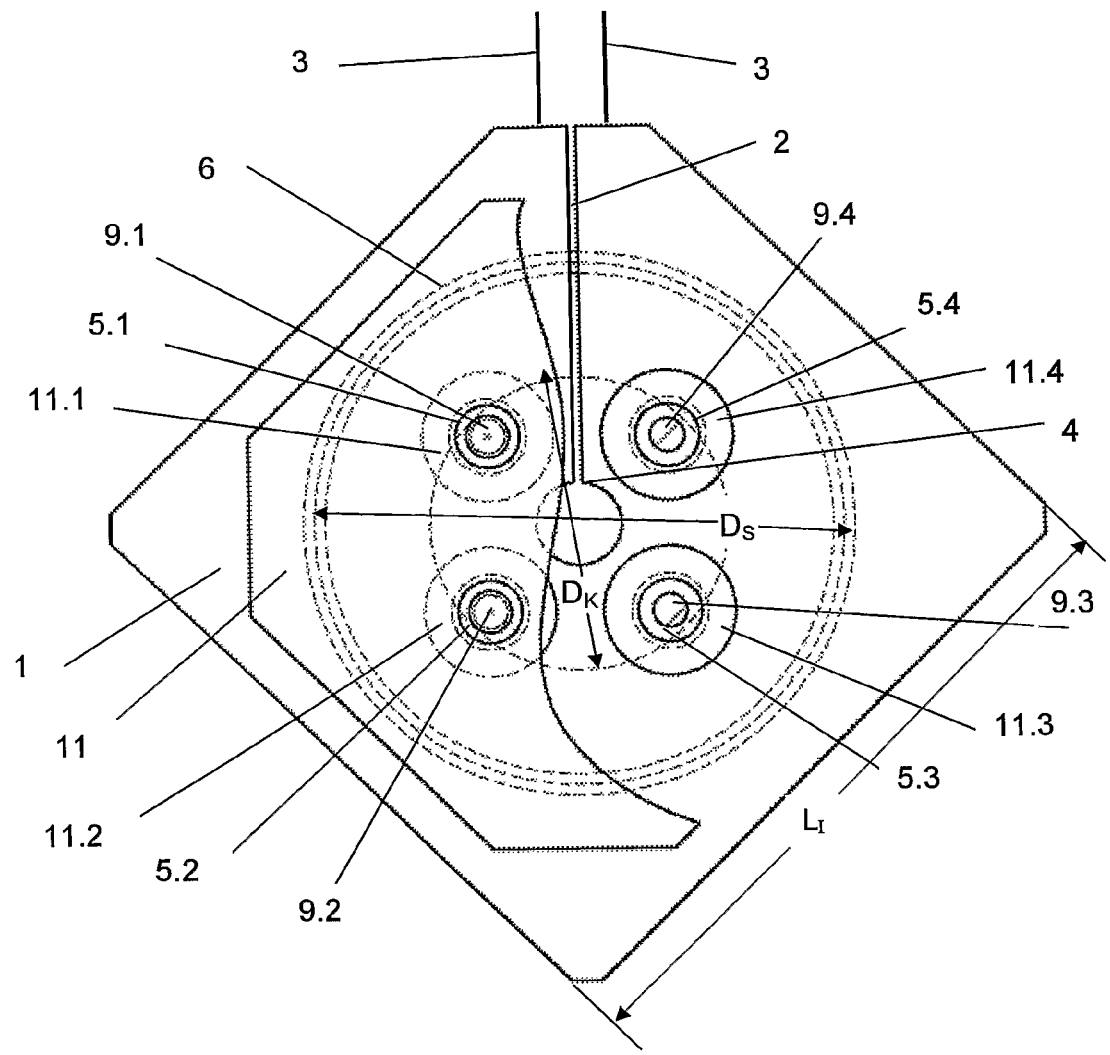
FIG. 1: View of the induction coil from above.

An aspect of the present invention provides a method and a device with which it is possible to produce a plurality of thin silicon rods at the same time in one operation from a stock rod with a standard diameter of, say, 120 mm, these thin rods having the material purity of float-zone Si crystals and the desired parameters. Thin rod production costs should be reduced with this method due to no longer having to produce special material, and operating and energy costs should also be reduced.

In an embodiment of the present invention, the thin rods are placed vertically in a reactor and heated to approx. 1100° C. by passing through electrical current so that silicon is deposited by pyrolysis on the rods from a mixture of trichlorosilane and hydrogen. This basic production process for polycrystalline silicon is very similar for both the electronics and the solar energy industry.

In an embodiment of the present invention, a flat induction coil with only one coil is used as the heating source, which simultaneously melts the upper end of a raw rod and at the same time serves to adjust the crystallisation front on the growing thin silicon rods which are drawn upwards from the melt pool. The plate-shaped single-coil induction coil used has a main slot which is designed as a current supply and has a central opening in the middle. According to the invention, the induction coil has further through holes around the central opening with circumfluent current which act as draw openings for the thin silicon rods. A sufficiently uniform temperature profile is generated under the induction coil through which the high frequency (HF) current flows, which causes a melt pool to form at the point of the stock rod. One thin silicon rod can be drawn upwards out of the underlying melt pool through each of the further draw openings in the induction coil. In contrast to the known prior art, no rod is drawn upwards through the central opening with circumfluent current; this is left free. The diameter of the single-coil induction coil is larger than the diameter of the raw Si rod which preferably has a relatively large diameter as per the industry standard. The further additional draw openings are preferably arranged concentrically or in pairs and in any event symmetrically with respect to the central opening. Their spacing is selected such that the growing thin silicon rods do not influence each other thermally to an excessive extent, so that the individual thin silicon rods grow as uniformly as possible. The larger the diameter of the raw Si rod used, the larger the diameter of the selected induction coil, and a corresponding number of additional draw openings can thus also be provided.

In an embodiment, means are advantageously provided above the induction coil to prevent active heat supply from the magnetic field of the induction coil to the crystallising thin silicon rods in order to promote uniform crystal growth.

In an embodiment of the method in an initial phase, after melting the point of the vertical raw silicon rod which is secured at its lower end, a silicon seed rod attached to a support is in each case brought into contact with the melt pool through each additional draw opening in the induction coil. When the crystals start to grow, the supports are drawn upwards at a speed such that a thin silicon rod grows uniformly on every support. The raw silicon rod is guided upwards during the drawing process at a speed such as to guarantee an adequate quantity of molten silicon at all times for all growing thin rods as a function of the upwards drawing speed of the thin silicon rods and the number of thin silicon rods.

All supports are preferably drawn upwards synchronously, i.e. at the same time and at the same speed.

Applicants have discovered that it is beneficial if the thin silicon rods have added dopants which permit direct and exclusive heating in the Siemens reactor. To make this possible, the molten silicon is doped with boron and/or other dopant elements by special means such that the drawn thin silicon rods display the required doping.

The method is preferably performed in a drawing chamber under an inert gas atmosphere.

In an embodiment of the present invention, the induction coil used as a heating source which only has one coil has further through holes in addition to the central opening, and which is adjacent to the main slot, and these holes are used as draw openings. There is no separate ring current around these draw openings, so they represent substantially passive through holes in induction terms in the plate of the induction coil. The draw openings have a diameter such that the thin silicon rods to be produced can be drawn through these holes. These further draw openings are preferably arranged in pairs and symmetrically or concentrically with respect to the central opening and at a sufficient distance from the edge of the induction coil. Adjacent draw openings are each located at similar distances such that the thin silicon rods drawn upwards through these openings have practically the same diameter and do not influence each other thermally to an excessive extent.

In an embodiment, the raw silicon rod used as a stock rod is located on a spindle which can be displaced vertically and can also rotate. Supports which can be displaced vertically, but which preferably do not rotate, are located above the induction coil and support the silicon seed rods used to grow the thin silicon rods. Each support is lowered through one draw opening in each case in the initial phase of the method until the silicon seed rod comes into contact with the melt pool at the upper end of the raw silicon rod. When the crystals start to grow, the support is drawn upwards at a speed such that a thin silicon rod grows on the inoculation rod and this is drawn through the relevant passive draw opening by means of the respective support in each case. The supports are preferably connected to one another such that they are moved upwards synchronously, at the same time and with the same drawing speed so that almost identical crystal growth is ensured for each thin silicon rod. Whilst the thin silicon rods grow and are drawn off upwards, the raw silicon rod with its spindle is guided upwards at such a speed that a sufficient quantity of molten material is always present so that the growing thin silicon rods can be drawn at an optimum drawing speed.

Preferably, the cross-section of the induction coil should be selected relative to the cross-section of the raw silicon rod used; this is always larger than that of the raw silicon rod. The induction coil according to the invention has four or more additional holes to draw thin silicon rods in the case of the current standard cross-sections of the raw silicon rods used.

In order to guarantee uniform crystal growth on the growing thin silicon rods, a shield plate is provided just above the induction coil which is intended to suppress inductive heat supply via the magnetic field of the induction coil to the crystallising thin silicon rods. The shield plate has openings in the form of through holes congruent to the draw openings in the induction coil. The growing thin silicon rods can thus be drawn upwards through the induction coil and the shield.

To ensure that as small as possible a drawing chamber can be used for the device, whilst still allowing as long as possible thin silicon rods to be drawn continuously, corresponding gas locks are provided through the upper wall of the drawing chamber to pass through the supports and the thin silicon rods. These gas locks usually consist of long tubes which have a slightly larger internal cross-section than the cross-section of the growing thin silicon rods.

The advantages of the method according to the invention and the device proposed to perform this method include the fact that a plurality of thin silicon rods can be produced at the same time in one drawing process using the floating zone method. Productivity thus increases in accordance with the number of thin silicon rods which are drawn simultaneously. The energy balance is also substantially improved when producing thin silicon rods, as a plurality of thin silicon rods can be produced at the same time with comparable energy usage.

FIG. 1 shows a view from above of an induction coil 1 designed in accordance with the invention. The induction coil 1 consists of a flat square metal plate. The edge length $L_I$ of the induction coil 1 is 160 mm and it is 10 mm thick in the example. The induction coil 1 has a main slot 2 along one of its diagonals and this main slot leads into a central opening 4 located in the middle of the induction coil 1. The current supplies 3 for the HF current are each located to the side of the main slot 2. According to the invention, the induction coil 1 has further through holes as well as the central opening 4 which act as draw openings 5.1, 5.2, 5.3, 5.4. Four thin silicon rods 9.1, 9.2, 9.3, 9.4 can be drawn separately or at the same time through these four draw openings 5.1, 5.2, 5.3, 5.4 in the selected example. The draw openings 5.1, 5.2, 5.3, 5.4 are distributed over the surface of the induction coil 1 in such a way that they display sufficient lateral distance from the edge of the induction coil. In the example, the draw openings 5.1, 5.2, 5.3, 5.4 are arranged concentrically around the central opening 4 on a circular ring which has a diameter $D_K$, which is approximately half the diameter $D_s$ of the raw silicon rod 6. The draw openings 5.1, 5.2, 5.3, 5.4 are thus above the melt pool 6.1 produced in the raw silicon rod 6. The draw openings 5.1, 5.2, 5.3, 5.4 are located at uniform distances from each other on the circular ring such that the growing thin silicon rods 9.1, 9.2, 9.3, 9.4 do not influence each other thermally to an excessive extent. The diameter of the draw openings 5.1, 5.2, 5.3, 5.4 is approx. 8 mm larger than the diameter of the growing thin silicon rods 9.1, 9.2, 9.3, 9.4, which in this case have a diameter of 8 mm. Depending on the surface area of the induction coil 1, which is 160 mm×160 mm in this case, as many draw openings can be incorporated in the induction coil as permitted by the above-mentioned criteria.

The raw silicon rod 6 is located beneath the induction coil 1 as a stock rod for providing the molten material used to draw the thin silicon rods. The edge length $D_I$ of the induction coil 1 measures 160 mm and as such is larger than the diameter $D_s$ of the raw silicon rod 6, which measures 120 mm, which means that the surface area of the induction coil 1 covers the entire cross-section of the raw silicon rod. This thus guarantees that the temperature profile generated by the induction coil 1 is able to melt the point of the raw silicon rod 6 completely.

Applicants have discovered that it is beneficial if the thin silicon rods used in the Siemens process are doped such that they display electrical conductivity in the range from 0.05 to 1 Ohm/cm. The thin silicon rods can be heated up to the required precipitation temperature by purely electrical means with this electrical conductivity. Additional heat sources are thus not required at the start of the Siemens process. The raw silicon rod 6 used here is also doped in this way.

Figure 2:
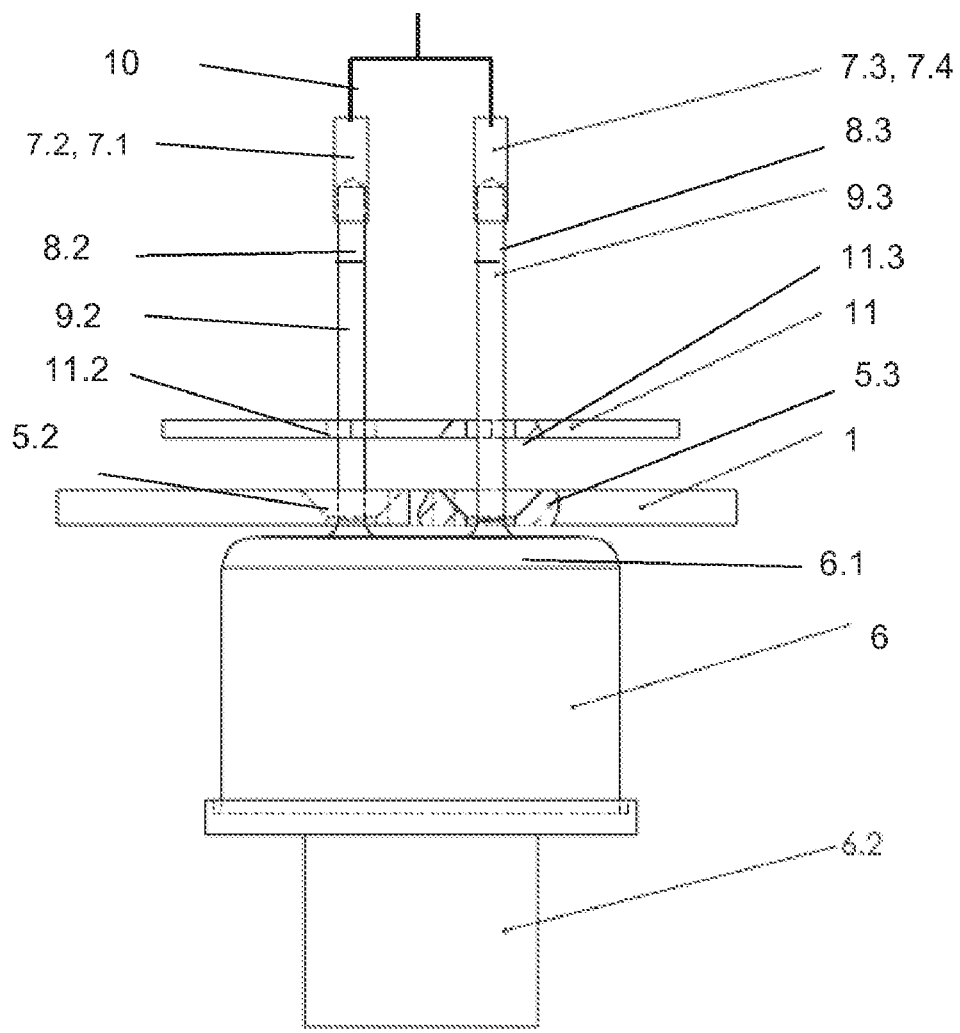
FIG. 2: Side view of the device.

FIG. 2 is a schematic side view of the device according to the invention. The method according to the invention is explained in further detail with the aid of FIG. 2. The drawing chamber in which the device is located and in which the method is performed is not shown. The gas locks located in the upper wall of the drawing chamber are likewise not shown.

Located beneath the induction coil 1 is the raw silicon rod 6 which acts as a stock rod for providing the material required to draw the thin silicon rods 9.1, 9.2, 9.3, 9.4, this material being melted by the temperature profile generated by the induction coil 1 in the form of a melt pool 6.1 at the point of the raw silicon rod 6. The raw silicon rod 6 is located on a spindle 6.2 which can be displaced vertically and rotated and which is connected to a motor which is not shown.

A cooled shield plate 11 is located directly above the induction coil 1, at a distance of approx. 15 mm, and this suppresses an inductive heat supply from the induction coil 1 to the crystallising thin silicon rods 9.1, 9.2, 9.3, 9.4, thus allowing the thin silicon rods to grow straight and uniformly. The shield plate 11 comprises a metal plate and, like the induction coil 1, has a square cross-section, the edge length of which more or less corresponds to the edge length $L_I$ of the induction coil. Openings 11.1, 11.2, 11.3, 11.4 in the form of through holes congruent to the draw openings in the induction coil 5.1, 5.2, 5.3, 5.4 are located in the shield plate 11. The growing thin silicon rods 9.1, 9.2, 9.3, 9.4 can thus be drawn upwards through the induction coil 1 and the shield plate 11.

The method begins with the raw silicon rod 6, with its spindle 6.2 which can be displaced vertically, being moved sufficiently close to the induction coil 1 through which high frequency current is passed so that a circular melt pool 6.1 is melted beneath the induction coil 1 at the point of the raw silicon rod 6 by the temperature profile generated by its magnetic field.

In the next stage the silicon seed rods 8.1, 8.2, 8.3, 8.4 attached to the supports 7.1, 7.2, 7.3, 7.4 are lowered vertically by means of a drawing device 10 through the openings 11.1, 11.2, 11.3, 11.4 in the shield plate 11 and the draw openings 5.1, 5.2, 5.3, 5.4 in the induction coil 1 until they come into contact with the melt pool 6.1. When the crystals start to grow, the supports 7.1, 7.2, 7.3, 7.4 are drawn upwards at a speed of approx. 10 mm/min such that a thin silicon rod 9.1, 9.2, 9.3, 9.4 grows on every silicon seed rod 8.1, 8.2, 8.3, 8.4 which is in each case secured to a support 7.1, 7.2, 7.3, 7.4. In the selected example, the supports 7.1, 7.2, 7.3, 7.4 are connected to each other and to a shared drawing device 10 such that all supports are moved upwards synchronously, at the same time and with the same drawing speed so that identical crystal growth is guaranteed for each thin silicon rod 9.1, 9.2, 9.3, 9.4.

The thin silicon rods 9.1, 9.2, 9.3, 9.4 growing on the respective silicon seed rods 8.1, 8.2, 8.3, 8.4 are drawn continuously upwards via the respective supports 7.1, 7.2, 7.3, 7.4 through the respective draw openings 5.1, 5.2, 5.3, 5.4 in the induction coil 1 and the openings 11.1, 11.2, 11.3, 11.4 in the shield plate 11 until the molten material stock from the raw silicon rod 6 is used up.

Whilst the growing thin silicon rods 9.1, 9.2, 9.3, 9.4 are drawn upwards by means of the supports 7.1, 7.2, 7.3, 7.4, the raw silicon rod 6 with its movable spindle 6.2 is guided vertically upwards such that there is always a sufficient stock of molten material in the melt pool 6.1 beneath the induction coil 1 for crystal growth on the thin silicon rods 9.1, 9.2, 9.3, 9.4. It is advantageous to rotate the raw silicon rod 6 with the spindle 6.2 so that a uniform molten melt pool 6.1 is created beneath the induction coil 1.

Figure 3:
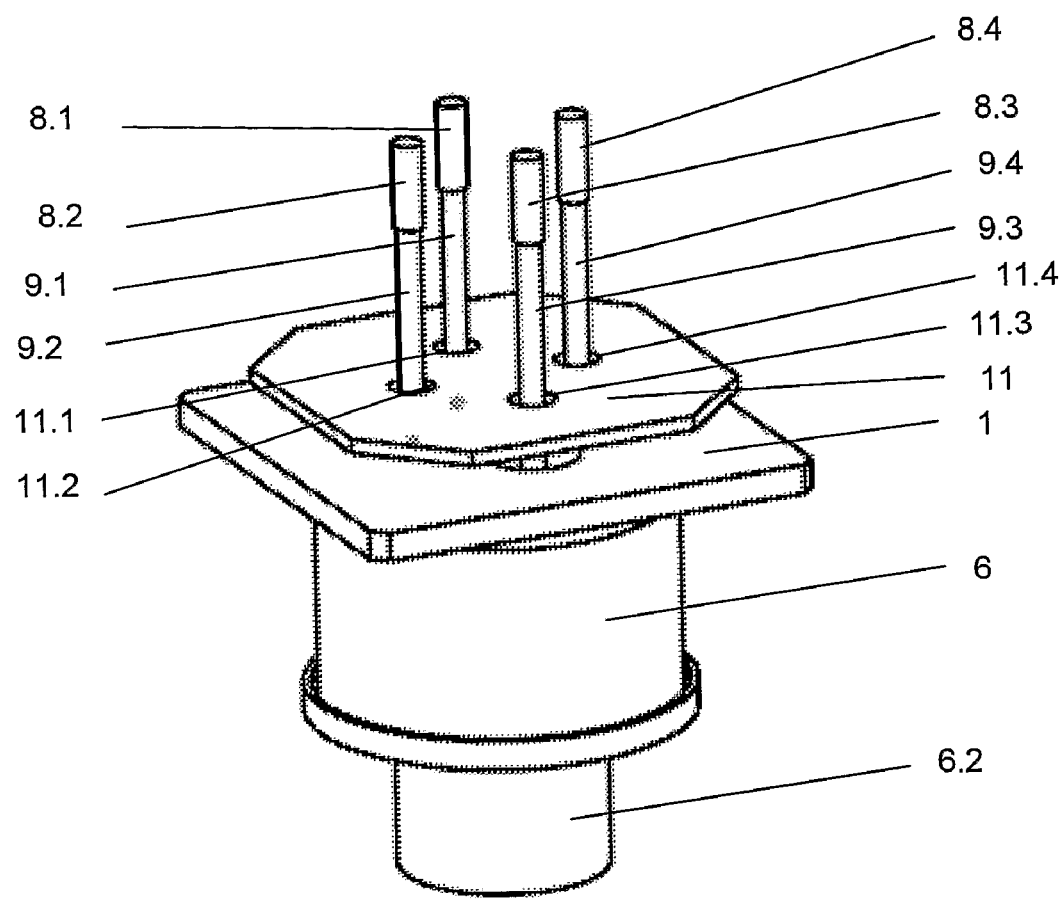
FIG. 3: Perspective view of the device.

FIG. 3 is a perspective view of the device according to the invention. It is clear that four thin silicon rods 9.1, 9.2, 9.3, 9.4 can be drawn at the same time. It is possible to see the raw silicon rod 6 located on the spindle 6.2 and extending from the induction coil 1 and also from the shield plate 11. Four growing thin silicon rods 9.1, 9.2, 9.3, 9.4 extend through the openings 11.1, 11.2, 11.3, 11.4 in the shield plate 11 and four silicon seed rods 8.1, 8.2, 8.3, 8.4 can be seen at their upper ends. The supports 7.1, 7.2, 7.3, 7.4 and the shared drawing device 10 are not shown here.

While the invention has been described with reference to particular embodiments thereof, it will be understood by those having ordinary skill the art that various changes may be made therein without departing from the scope and spirit of the invention. Further, the present invention is not limited to the embodiments described herein; reference should be had to the appended claims.

List of Reference Numerals
 1 induction coil
 2 main slot
 3 current supplies
 4 central opening
 5.1, 5.2, 5.3, 5.4 draw openings
 6 raw silicon rod
 6.1 melt pool
 6.2 spindle
 7.1, 7.2, 7.3, 7.4 supports
 8.1, 8.2, 8.3, 8.4 silicon seed rods
 9.1, 9.2, 9.3, 9.4 thin silicon rods
 10 drawing device
 11 shield plate 11.1, 11.2, 11.3, 11.4 openings in the shield plate
$L_I$ edge length of the induction coil
$D_s$ diameter of the raw silicon rod
$D_K$ diameter of the circle on which the draw openings are located

The invention claimed is:

1. A method for producing thin silicon rods using a floating zone crystallization process, the method comprising:
supplying high frequency (HF) current to a flat induction coil having a central opening, a plurality of draw openings and a plate with a slot as a current supply of the HF current so as to provide a circumfluent current to the central opening;
heating an upper end of a raw silicon rod by induction using the flat induction coil so as to form a melt pool; and
drawing a respective thin silicon rod upwards through each of the plurality of draw openings in the flat induction coil from the melt pool without drawing a thin silicon rod through the central opening having the circumfluent current.

2. The method as recited in claim 1, wherein the flat induction coil has one coil.

3. The method as recited in claim 1, wherein the drawing includes an initial phase in which each of a plurality of silicon seed rods is attached to a support and contacts the melt pool at the raw silicon rod via a respective one of the plurality of draw openings and a growth phase in which each of the plurality of silicon seed rods is drawn through the respective one of the plurality of draw openings.

4. The method as recited in claim 3, wherein the drawing includes drawing the plurality of supports with the plurality of silicon seed rods and the thin silicon rods synchronously upwards.

5. The method as recited in claim 1, further comprising suppressing inductive heat to the plurality of thin silicon rods during a crystallization of the plurality of thin silicon rods using a device disposed above the induction coil.

6. The method as recited in claim 1, wherein the drawing includes guiding the raw silicon rods upwards at a speed so as to maintain a quantity of molten material in the melt pool sufficient to grow the plurality of thin silicon rods.

7. The method as recited in claim 1, wherein the raw silicon rod is doped with at least one of boron and other dopants such that the plurality of thin silicon rods display a preselected doping.

8. The method as recited in claim 1, wherein a dopant is added to the melt pool.

9. The method as recited in claim 1, wherein the method is performed in a sealed vessel under an inert gas atmosphere.

10. The method as recited in claim 1, wherein the drawing is performed continuously from a drawing chamber into an outer area using gas locks disposed in an upper part of the drawing chamber, the drawing process continuing until a molten stock of material from the raw silicon rod is depleted.

11. A device for producing thin silicon rods using a floating zone crystallization process, the device comprising:
a flat induction coil having a central opening, a plurality of draw openings and a plate with a slot as a current supply configured to provide a circumfluent high frequency (HF) current to the central opening without providing a ring current to the plurality of draw openings, each of the plurality of draw openings being configured to accommodate a thin silicon rod.

12. The device as recited in claim 11, wherein the flat induction coil has one coil.

13. The device as recited in claim 11, wherein the plurality of draw openings are disposed concentrically with respect to the central opening and equidistantly with respect to each other.

14. The device as recited in claim 11, wherein the plurality of draw openings are disposed in pairs, each pair disposed symmetrically with respect to the central opening.

15. The device as recited in claim 11, wherein a cross section of the flat induction coil completely covers a cross section of the raw silicon rod.

16. The device as recited in claim 11, further comprising a shield plate disposed above the induction coil and having a plurality of openings which are congruent to the plurality of draw openings of the induction coil.

17. The device as recited in claim 11, wherein the raw silicon rod is disposed on a spindle configured to be rotated and displaced vertically.

18. The device as recited in claim 11, further comprising a plurality of vertically displaceable supports each connectable to a respective one of the plurality of thin silicon rods via a plurality of silicon seed rods.

19. The device as recited in claim 18, wherein each of the plurality of supports is configured to be moved upwards synchronously.

20. The device as recited in claim 18, wherein the plurality of supports are disposed on a shared drawing device.

21. The device as recited in claim 11, further comprising a gas-tight drawing chamber having a plurality of gas locks including a plurality of long tubes disposed in an upper vessel wall of the drawing chamber respectively above the plurality of draw openings so that each of the plurality of thin silicon rods can be drawn through a respective one of the plurality of long tubes.

* * * * *